United States Patent [19]
Hause et al.

[11] Patent Number: 5,759,871
[45] Date of Patent: Jun. 2, 1998

[54] STRUCTURE FOR TESTING JUNCTION LEAKAGE OF SALICIDED DEVICES FABRICATED USING SHALLOW TRENCH AND REFILL TECHNIQUES

[75] Inventors: Frederick N. Hause; Charles E. May; Robert Dawson, all of Austin, Tex.

[73] Assignee: Advanced Micro Devices, Inc., Sunnyvale, Calif.

[21] Appl. No.: 687,858

[22] Filed: Jul. 26, 1996

[51] Int. Cl.$^6$ .................................... H01L 21/66
[52] U.S. Cl. .................... 438/18; 438/14; 438/682
[58] Field of Search ................... 438/14, 18, 17, 438/682

[56] References Cited

U.S. PATENT DOCUMENTS

| 4,144,493 | 3/1979 | Lee et al. | 324/158 |
| 5,504,354 | 4/1996 | Mohsen | 257/209 |
| 5,670,891 | 9/1997 | Ling et al. | 324/765 |

FOREIGN PATENT DOCUMENTS

| 55-158646 A | 12/1980 | Japan . |
| 59-086234 A | 5/1984 | Japan . |
| 61-212060 A | 9/1986 | Japan . |
| 4-333255 | 11/1992 | Japan . |
| 7-135241 A | 5/1995 | Japan . |

OTHER PUBLICATIONS

Girard P. et al, "Low Leakage Current Evaluations For Process Characterizatins", Proceedings of the European Solid State Device Research Converence, Nottingham, Sep. 10–13, 1990, NR. Conf. 20, pp. 197–200.

IBM Technical Disclosure Bulletin, vol. 30, No. 5, Oct. 1, 1987, pp. 385–386 "Monitor for Assurance of Trench Channel Stop Doping".

*Primary Examiner*—Tuan H. Nguyen
*Attorney, Agent, or Firm*—Skjerven, Morrill, MacPherson, Franklin & Friel LLP; Ken J. Koestner

[57] ABSTRACT

A resistor protect mask is used on a shallow trench isolation device junction to cover a device area except for a strip on the perimeter of the device area. The silicide layer formed on the central surface portion of the device and the strip area on the perimeter of the device upon which silicide formation is prevented forms a test structure for evaluation of junction formation that is immune from the effects of silicide formation on a device trench sidewall. Electrical tests and leakage measurements upon the test structure are compared directly to similar silicide shallow trench isolated devices which do not incorporate the resistor protect mask and shallow trench isolated devices without silicide to determine whether salicide processing is a cause of junction effects including junction leakage and short-circuiting.

4 Claims, 4 Drawing Sheets

STRUCTURE FOR TESTING JUNCTION LEAKAGE OF SALICIDED DEVICES FABRICATED USING SHALLOW TRENCH AND REFILL TECHNIQUES

BACKGROUND OF THE INVENTION

1. Field of the Invention

The present invention relates to integrated circuit test structures and procedures. More specifically, the present invention relates to a test structure and testing procedure for silicided junctions of devices isolated using shallow trench and refill techniques.

2. Description of the Related Art

Shallow trench and refill techniques have been developed to effectively isolate devices in deep-submicron MOS technologies. A shallow trench and refill isolation structure is formed by etching a relatively shallow trench, for example 0.3–0.5 μm in depth, into a silicon substrate, growing a thin thermal oxidation layer on the trench walls to control silicon-silicon oxide interface quality, and refilling the trench with an insulator material. The surface is then planarized after refill to form an isolation structure.

Shallow trench and refill techniques advantageously form a small isolation spacing due to elimination of bird's beak and reduction of channel-stop dopant redistribution. The fully-recessed form of the resulting isolation structure makes possible a desirable planar surface. In addition, field-oxide thinning in narrow isolation spaces is avoided so that threshold voltage is maintained at a constant level as a function of channel width. A further advantage of shallow trench and refill techniques is that MOSFETs fabricated with fully-recessed oxide isolation exhibit a relatively large transconductance $g_m$ values. Also, fully-recessed structures with sharp lower corners furnish improved isolation efficiency due to a "corner effect" in which field lines at the bottom corners of a trench spread in the vicinity of a corner, leading to a higher threshold at the corners.

However, several limitations and disadvantages are characteristic of shallow trench and refill techniques.

One drawback of the isolation structure formed by the shallow trench and refill technique is a possible degradation in device operating behavior. In a conventional LOCOS-isolated MOSFET such as a MOSFET 100 shown in FIG. 1, a polysilicon gate formed across the surface of a device slopes away from the device beginning at the edge of the isolation oxide region. In the case of a MOSFET isolated using local oxidation of silicon (LOCOS) isolation, for example MOSFET 200 shown in FIG. 2A and a MOSFET isolated using a shallow trench isolation, for example MOSFET 202 shown in FIG. 2B, the gate region forms a flat surface across the isolation so that the part of the gate overlying the field region creates a larger two-dimensional fringing field on the corner and sidewall of the silicon mesa structure as compared to the behavior of a LOCOS-isolated MOSFET. This two-dimensional fringing field establishes a corner parasitic MOSFET in parallel with the main channel device. The parasitic device is activated at gate voltages lower than the voltages that activate the main channel device, increasing the subthreshold leakage of the device. This parasitic effect is enhanced if the isolation oxide region is partly etched below the silicon mesa top surface, causing to wrap around the corner of the mesa structure. The regions of the channel near the edges of the device behave much differently then the region at the center of the mesa.

Subthreshold characteristics of narrow MOSFETs which are isolated by refilled shallow trench structures are sensitive to the shape of the upper trench corner.

Edges of a silicon mesa at upper corners of a shallow trench structure device are activated by the portion of the gate that overlaps such corner regions. Edge activation becomes even stronger when the isolation region is partially eroded so that the gate wraps around the corner of the device.

Accordingly, shallow trench isolation is best achieved by a gate structure that runs flat across the isolation region, which is attained when the device structure prior to polysilicon layer is planar. One fabrication technique for achieving a planar device structure is a process utilizing reactive ion etching (RIE) etchback followed by a chemical-mechanical polishing operation.

Another drawback is thining of the gate oxide at the edge of the trench. Thinned gate oxide degrades gate oxide reliability and worsens the parasitic device problem since a thinner gate oxide increases the electric field strength at the trench corner.

The corner is also exposed from spacer etch and other oxide etches, both wet and dry etches, after formation of the shallow trench isolation.

Another problem with shallow trench isolation arises with the usage of salicide processing. Salicide processing is used to reduce resistance values that result from reduction in the contact dimensions of integrated circuits causing increases in contact resistance and sheet resistivity of shallow-junctions of source/drain regions. Referring to FIG. 3, a sectional view of a semiconductor wafer 300 shows a device area 312 formed in a silicon substrate 310 and including an N+ type doped area 314 and a P– type doped area 316. Isolation oxide 318 is formed lateral to the device area 312. During salicide processing, a layer of silicide material 320 is formed covering the device area 312. The silicide material 320 may wrap around a corner 322 of the silicon device area 312, forming a silicide layer 324 at a level below the area covering the surface 326 of the silicon device area 312. The unintended silicide layer 324 can cause junction leakage by formation of silicide in too close a proximity to the junction 328 of the N+ type 314 and P– type 316 doped areas. In some instances, the junction 328 may be short-circuited. Subsequent processing, including etching and cleaning processes, erodes the silicon even further, approaching or extending to the junction, causing junction leakage and potentially leading to a short-circuit condition.

To fabricate operational integrated circuits, junction leakage and short-circuiting must be prevented. However, many various semiconductor processing steps other than silicide formation at the junctions may also cause junction leakage and short-circuiting.

What is needed is a test structure that accurately determines whether salicide processing and silicide formation in close proximity to device junctions is a cause of junction leakage and short-circuiting.

SUMMARY OF THE INVENTION

In accordance with the present invention, a resistor protect mask is used on a shallow trench isolation device junction to cover a device area except for a strip on the perimeter of the device area. The silicide layer formed on the central surface portion of the device and the strip area on the perimeter of the device upon which silicide formation is prevented forms a test structure for evaluation of junction formation that is immune from the effects of silicide formation on a device trench sidewall. Electrical tests and leakage measurements upon the test structure are compared directly to similar silicide shallow trench isolation devices of two types. One silicide shallow trench structure does not incorporate the resistor protect mask to determine whether salicide processing is a cause of junction effects including junction leakage and short-circuiting. Another silicide shallow trench structure is a device without silicide. Electrical testing of the three shallow trench isolation devices is diagnostic of the status of field oxide formation, silicide formation, and junction formation. If electrical testing shows no leakage for all three structures, field oxide formation, silicide formation, and junction formation are all suitable. If leakage occurs only for the shallow trench structure that does not incorporate the resistor protect mask, the leakage results from problems with silicide formation. Leakage occurring for all three devices is indicative of problems with junction formation.

Many advantages are achieved by the described silicided junction leakage test structure and method. One advantage is that the structure is fabricated using only semiconductor process steps, including deposition, masking and etching steps, that are performed for fabrication of operating circuit structures including active devices and high value resistors. Another advantage is that the silicided junction leakage test structure evaluates junction formation of silicided devices while avoiding leakage effects at the sidewalls of the trenches adjacent to the test structure. A further advantage is that the test structure may be used not only to detect leakage problems and to quantify the amount of leakage, but also to determine whether the leakage results from the silicide or some other structure, such as the field oxide. Further advantages are attained by the described structure and method of forming the structure and testing the structure as integrated circuits are continually reduced in scale.

BRIEF DESCRIPTION OF THE DRAWINGS

The features of the invention believed to be novel are specifically set forth in the appended claims. However, the invention itself, both as to its structure and method of operation, may best be understood by referring to the following description and accompanying drawings.

DETAILED DESCRIPTION OF THE PREFERRED EMBODIMENTS

Figure 1:
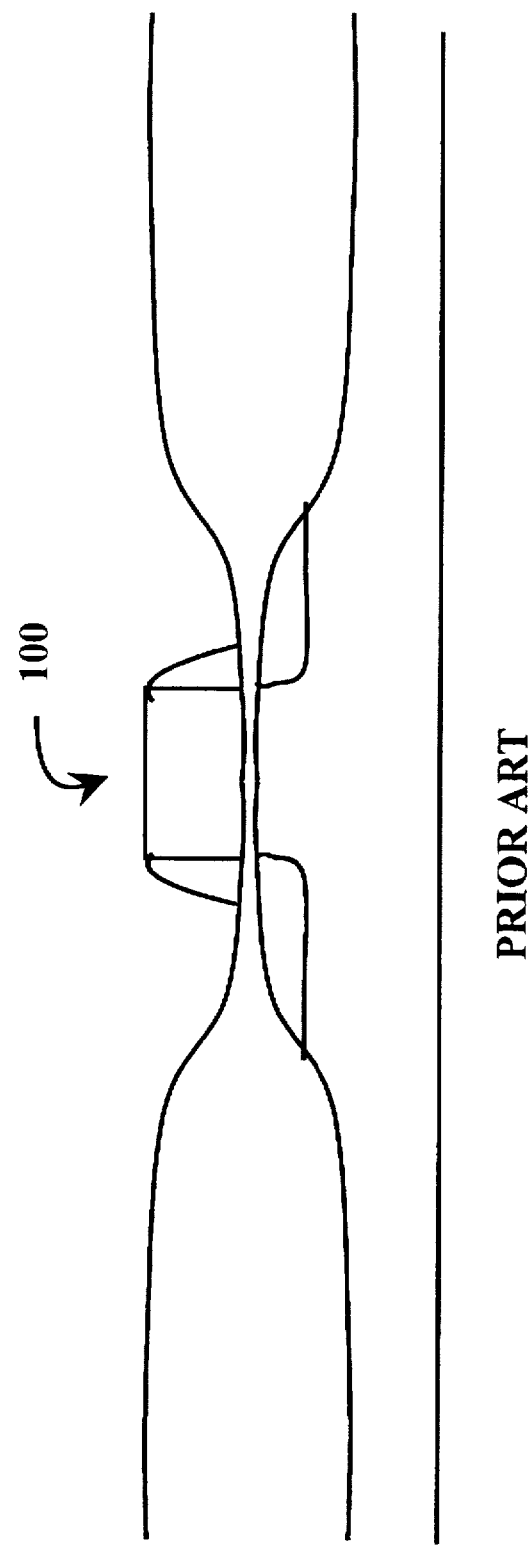
FIG. 1, labeled PRIOR ART, is a sectional view of a conventional LOCOS-isolated MOSFET with a polysilicon gate formed across the surface of a device that slopes away from the device beginning at the edge of the isolation oxide region.
Figure 2A:
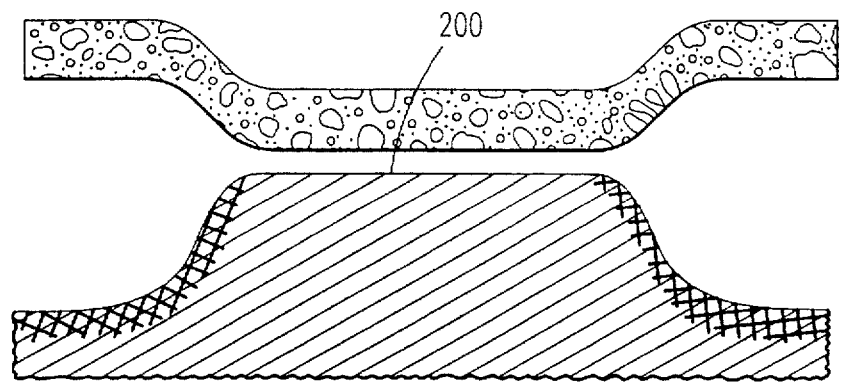
FIGS. 2A and 2B, also labeled PRIOR ART, are respective sectional views of a LOCOS-isolated MOSFET and a MOSFET isolated using a shallow trench so the gate region forms a flat surface across the isolation.
Figure 2B:
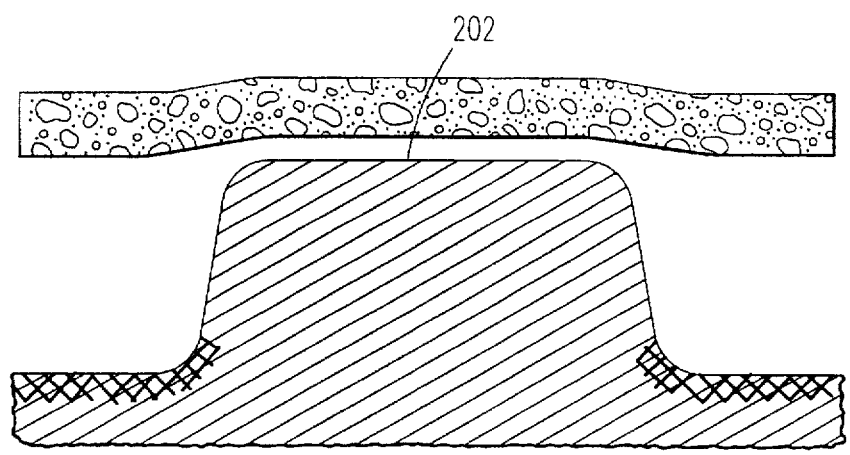
Figure 3:
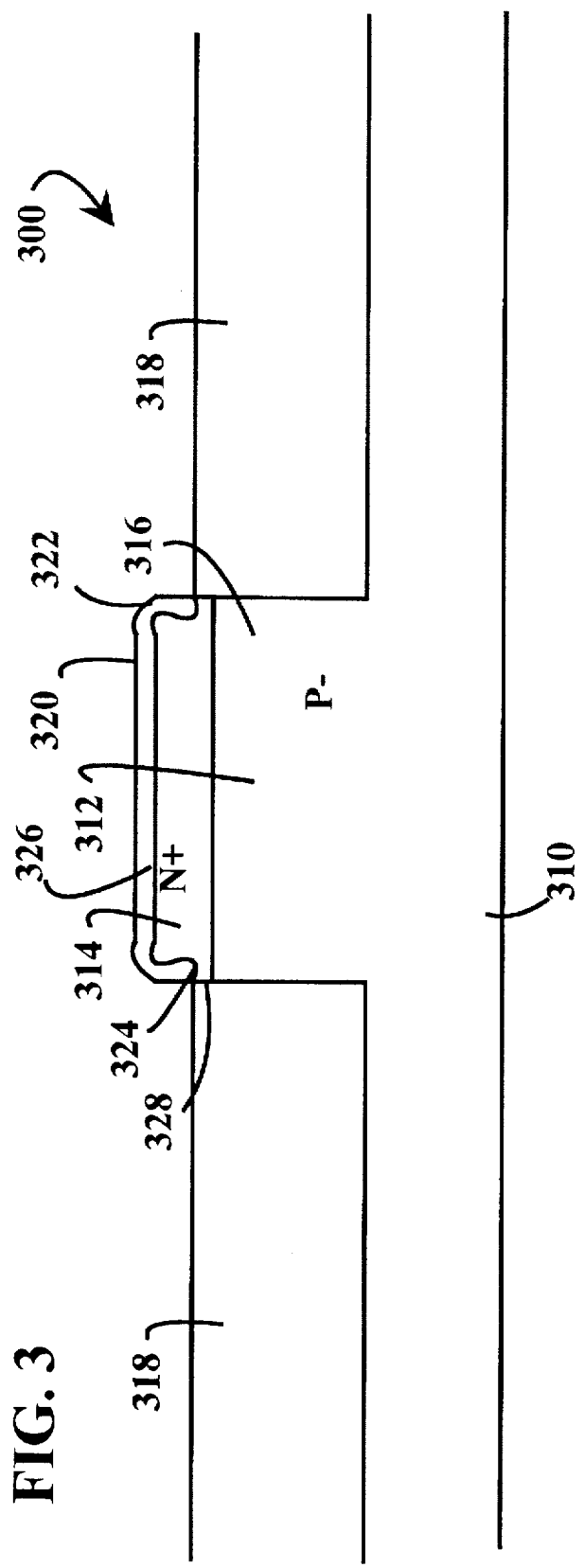
FIG. 3 is a sectional view of a semiconductor wafer formed using shallow trench isolation and including a silicide layer.
Figure 4A:
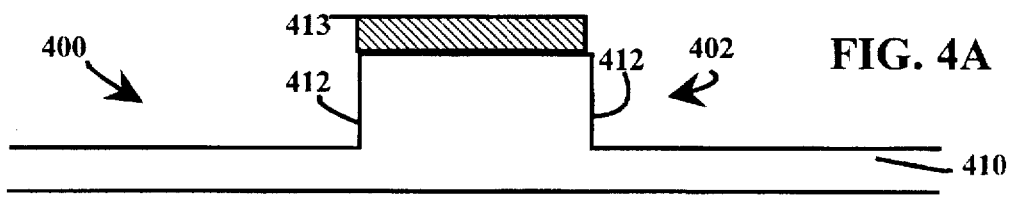
FIGS. 4(A) through 4(F) are sectional views of a semiconductor wafer showing a sequence of semiconductor processing steps for fabricating a silicided junction leakage test structure in accordance with an embodiment of the present invention.

Referring to FIGS. 4(A) through 4(F), several sectional views of a semiconductor wafer 400 illustrate a sequence of semiconductor processing steps for fabricating a silicided junction leakage test structure 402 using shallow trench isolation, which is generally used for isolating devices of the same type. FIG. 4(A) illustrates a silicon substrate 410 which is processed using a shallow trench isolation method involving the etching of shallow trenches 412 into a silicon substrate 410 then refilling the trenches. The shallow trenches 412 are etched lateral to the silicided junction leakage test structure 402 which is protected from etching by a silicon nitride layer 413 which is patterned using photoresist. The silicon nitride layer 413, typically having a thickness of 100–200 nm, functions as an oxidation mask. A photoresist pattern is typically deposited to protect areas of the semiconductor wafer 400 upon which all active devices, including the test structure 402 are subsequently formed. The shallow trenches 412, generally having a depth in a range from 0.2 µm to 0.8 µm, are anisotropically etched into the silicon substrate 410 by a dry etching procedure. Shallow trenches 412 are etched with a silicon etch to form vertical trench sidewalls. In other embodiments, shallow trenches are etched with an orientation-dependent silicon etch to form a selected inclination of the trench sidewalls.

In some embodiments, a thin thermal oxide, typically having a thickness of 20–50 nm, is grown to passivate the trench sidewalls prior to deposition of the CVD oxide 414 to fill the shallow trenches 412.

Figure 4B:
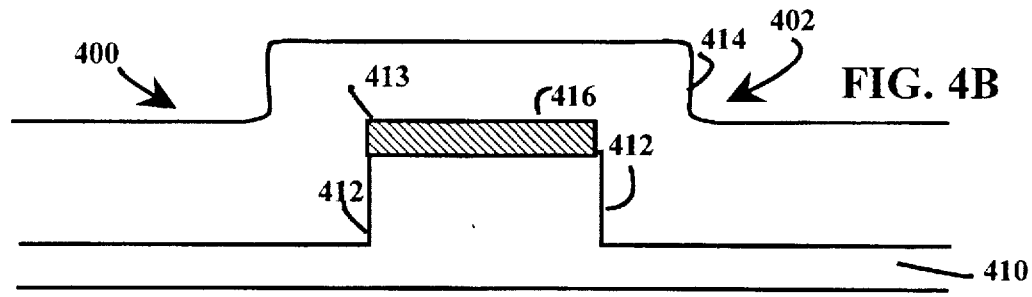

Referring to FIG. 4(B), a chemical vapor deposition (CVD) oxide 414 is then formed on the surface 416 of the silicon substrate 410 with the silicon nitride layer 413 functioning as an integral oxidation barrier during an oxide growth step. The test structure device 402 is defined, as well as active devices in other regions of the semiconductor wafer 400, with a photolithographic process.

Figure 4C:
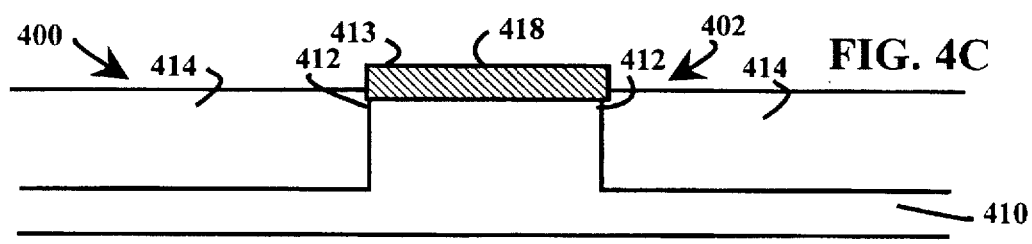

The CVD oxide 414 is etched back generally using either a dry-chemical or wet-chemical etching process so that the test structure 402 takes the form shown in FIG. 4(C) in which the CVD oxide layer 414 is etched back, leaving the oxide only in the recesses of the shallow trenches 412 and the top of the oxide substantially level or recessed with respect to the silicon nitride surface 416. The CVD oxide 414 is subsequently processed using a chemical-mechanical polish (CMP) procedure to improve global planarity and reduce the topology on the semiconductor surface. The CVD oxide 414 remains only in the shallow trenches 412 lateral to the silicided junction leakage test structure 402. The CVD oxide 414 is planarized so that the top surface 418 of the CVD oxide 414 is recessed below the level of the silicon nitride substrate surface 416 in the vicinity of the test structure 402.

Figure 4D:
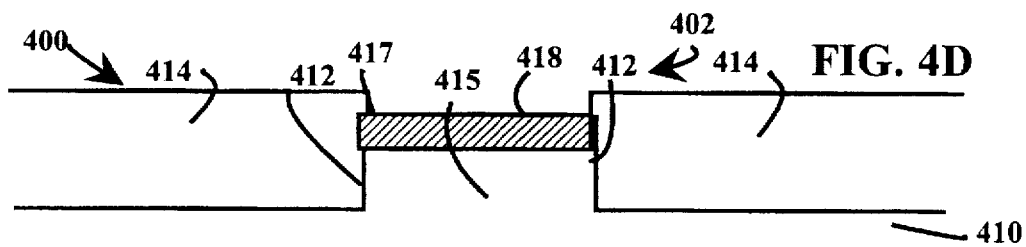
Figure 4E:
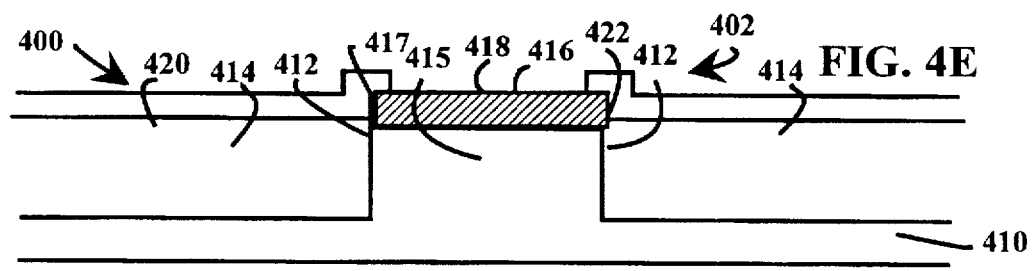

Referring to FIG. 4(D), the silicon nitride substrate surface 416 is removed and the silicon substrate 410 is doped, for example by implanting P− type ions such as a boron implant in a buried layer 415 and implanting N+ type ions, for example an arsenic implant, in a layer 417 adjacent to the top surface 418.

One problem with shallow trench isolation is that the electric field concentration at a sharp-edge corner of an active transistor reduces the threshold voltage of the corner region so that a device turns on at a lower voltage than the interior portion of a device. This problem is accentuated if the field oxide has a downward step structure. The larger the step, the lower the threshold voltage and unwanted sub-threshold conduction begins at progressively lower values of $V_{GS}$. One technique for improving the performance of MOSFET devices using shallow trench isolation is through a salicide process to reduce the Miller capacitance, the charge carrier capacitance of the source/drain, and reduce the source/drain series resistance. The salicide process reduces the source/drain and polysilicon resistance values.

In the salicide process, self-aligned silicides are formed on the source/drain regions of a semiconductor substrate at the same time as a polycide structure is formed. Self-aligned silicide contacts are formed by contacting the entire source and drain regions of a MOSFET with a conductor film, typically using a self-aligned process that does not employ additional masking steps. The salicide process sequence includes the step of forming sidewall spacers for polysilicon gates after source and drain regions are implanted. Then, referring to FIG. 4(E), a resistor protect mask 420 is deposited and patterned on the semiconductor wafer 400 on peripheral edges of the silicided junction leakage test structure 402 and on various resistor structures (not shown) formed in other regions of the semiconductor wafer 400. The resistor protect mask 420 formed on the shallow trench isolation device junction 422 allows formation on silicide on substantially all of the top surface of the silicided junction leakage test structure 402, but leaving the perimeter uncovered by the silicide.

The resistor protect mask 420 is deposited and patterned for fabricating resistors in various locations of the semiconductor wafer 400 that are not shown in FIGS. 4(A) through 4(F). Specifically, the resistor protect mask 420 is deposited and patterned to form resistors having a high sheet rho so that useful sized resistors are formed on the semiconductor wafer 400 without consuming a large circuit area. Thus, the silicided junction leakage test structure 402 is advantageously fabricated using only semiconductor process steps, including deposition, masking and etching steps, that are performed for fabrication of operating circuit structures including active devices and high value resistors. No extra processing steps are employed in forming the silicided junction leakage test structure 402, instead the test structures are formed simply by mere modifications to pattern structures.

Figure 4F:
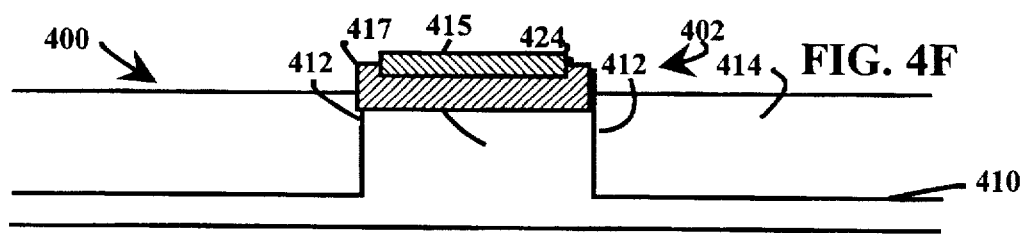

Referring to FIG. 4(F), a metal layer 424 is deposited over the test structure 402 and active device MOS structures (not shown) in other portions of the semiconductor substrate 400 to form a silicide. Silicides are reacted from various materials that are used as contact metals for contacting silicon, including PtSi, $Pd_2Si$, $CoSi_2$, $NiSi_2$ and $TiSi_2$. For fabricating shallow junctions, processing technology operates at relatively low temperatures to avoid formation of deep junctions. $TiSi_2$ and group-VIII metal suicides are beneficially used for self-aligned ohmic contacts and local interconnects to silicon because the $TiSi_2$ and group-VIII metal suicides have a low resistivity and $TiSi_2$ and group-VIII metals react with silicon at temperatures of 600° C. or less. Furthermore, when the $TiSi_2$ and group-VIII metal silicides are formed at low temperatures, the metal ions diffuse into the Si and react with the Si. As the metal atoms diffuse into the $SiO_2$, no Si is available for reaction so that the metal overlying the $SiO_2$ remains unreacted.

The metal is reacted with exposed silicon regions by heating the semiconductor wafer 400, causing a silicide reaction leaving reacted silicide 426 to occur in locations where the metal is in contact with the silicon. In other locations, including mask-protected edges of the test structure 402, the metal remains unreacted.

The resistor protect mask 420 prevents silicide formation on the periphery and immediately adjacent regions of the silicided junction leakage test structure 402 while allowing formation of the silicide 426 throughout most of the top surface of the test structure 402 interior to the protected peripheral area. The silicided junction leakage test structure 402 resulting from this fabrication procedure advantageously is used for evaluating junction formation of silicided devices while avoiding leakage effects at the sidewalls of the trenches adjacent to the test structure 402.

Unreacted metal is selectively removed from the surface of the semiconductor wafer 400 using an etchant that does not attack the reacted (formed) silicide, the silicon substrate or the silicon oxide so that the silicided junction leakage test structure 402 and each exposed source and drain region is completely covered by a silicide film 426. In subsequent steps, a dielectric layer is deposited onto the silicide and contact holes are formed in the dielectric layer to allow access to the silicide layer. Metal is deposited into the contact holes to make contact to the silicide.

Leakage measurements obtained by electrical testing of the silicided junction leakage test structure 402 are directly compared to leakage measurements acquired for similarly silicided active devices on the semiconductor wafer 400 which are formed without resistor protect masking so that the entire surface of the active devices, including the peripheral region of the active devices, are covered with silicide and compared to nonsilicided junctions.

In the salicide structures without resistor protect masking, silicide is formed in the diffusion areas and on the polysilicon gate. Oxide spacers typically separate the diffusion areas and the polysilicon gate by only about 200–3000Å. A lateral formation of silicon can bridge this separation and cause the gate to be short-circuited to the source/drain. The silicided leakage test structure 402 is supplied to detect short-circuiting and to determine whether salicide structures are the source of such short-circuiting.

Electrical leakage measurements are typically made, both for the silicided leakage test structure 402 and salicide structures without resistor protect masking, by reverse biasing diodes in the two structures and measuring the conduction through the biased junction. A leakage path through the silicide causes the reverse-biased junction to carry substantially more current. Leakage is also tested by forward-biasing the diodes in the two structures to determine whether a silicide bridge has completely short-circuited the junction. The forward-biased leakage test also determines whether the applied forward bias voltage causes the diode to activate prematurely. The normal breakdown voltage of such a diode is on the order of several volts. A smaller breakdown voltage, for example half the normal voltage, is indicative that the silicide is too close to the junction.

A further leakage test is made by reverse bias and forward bias testing not only the silicided leakage test structure 402 and salicide structures without resistor protect masking, but also an unsilicided diode. This further test determines not only whether devices are operating correctly and the amount of leakage, but also determines whether incorrect operation is caused by the silicide rather than another structure such as the field oxide.

While the invention has been described with reference to various embodiments, it will be understood that these embodiments are illustrative and that the scope of the invention is not limited to them. Many variations, modifications, additions and improvements of the embodiments described are possible.

What is claimed is:

1. A method of fabricating a test structure comprising the steps of:

etching a shallow trench in a semiconductor substrate laterally surrounding a device, the device having an upper surface;

forming an isolating oxide surrounding and overlying the device;

planarizing the isolating oxide so that the upper surface of the device is exposed;

implanting ions into the device so that an active device is formed;

depositing and patterning a resistor protect mask on the upper surface of the active device so that the peripheral edges of the active device are protected and a medial portion of the active device is exposed; and depositing and reacting a silicide metal in the medial portion of the active device, the resistor protect mask preventing silicide formation on the peripheral edges of the active device.

2. A method according to claim 1 wherein the ion implanting step further comprises the steps of:

implanting a buried layer of ions of a first type; and implanting a surface layer of ions of a second type complementary to the first type so that a diode is formed.

3. A method according to claim 1 wherein isolating oxide planarizing step further comprises the step of planarizing the isolating oxide to form a surface substantially level to the upper surface of the device.

4. A method according to claim 1 wherein isolating oxide planarizing step further comprises the step of planarizing the isolating oxide to form a surface recessed from the upper surface of the device.

* * * * *